(12) United States Patent
Matsumoto et al.

(10) Patent No.: US 7,407,712 B2
(45) Date of Patent: Aug. 5, 2008

(54) RELEASE FILM

(75) Inventors: Hirotake Matsumoto, Mishima-gun (JP); Hitoshi Shirato, Mishima-gun (JP); Hidekazu Inoue, Mishima-gun (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 10/549,115

(22) PCT Filed: Dec. 26, 2003

(86) PCT No.: PCT/JP03/16905

§ 371 (c)(1),
(2), (4) Date: Nov. 14, 2005

(87) PCT Pub. No.: WO2005/066246

PCT Pub. Date: Jul. 21, 2005

(65) Prior Publication Data

US 2006/0154095 A1    Jul. 13, 2006

(51) Int. Cl.
  *B32B 27/36*    (2006.01)
  *C08L 67/00*    (2006.01)
(52) U.S. Cl. .................. 428/480; 428/349; 428/431
(58) Field of Classification Search ................ 428/349, 428/431, 480
  See application file for complete search history.

(56) References Cited

U.S. PATENT DOCUMENTS 5,080,979 A    1/1992    Shigemoto et al.

FOREIGN PATENT DOCUMENTS

| EP | 1 135 012 A2 | 9/2001 |
| EP | 1 302 496 A1 | 4/2003 |
| EP | 1 453 364 A1 | 9/2004 |
| JP | H2-175247 | 7/1990 |
| JP | H5-283862 | 10/1993 |
| JP | 2002-252458 A | 9/2002 |
| JP | 2003-012829 A | 1/2003 |
| JP | 2003-313313 | 11/2003 |
| JP | 2003-327655 A | 11/2003 |
| JP | 2004-002592 A | 1/2004 |
| JP | 2004-002593 A | 1/2004 |
| JP | 2004-002789 A | 1/2004 |
| WO | WO 90/11182 | 10/1990 |
| WO | WO 03/009655 A1 | 1/2000 |
| WO | WO 00/28798 | 5/2000 |

OTHER PUBLICATIONS

XP002439537 (for JP 2003-313313 A).

*Primary Examiner*—Duc Truong
(74) *Attorney, Agent, or Firm*—Sughrue Mion, PLLC

(57) ABSTRACT

It is an object of the present invention to provide a release film which is superior in the flexibility at high temperature, the conformability to circuit patterns, the heat resistance, the releasing property and the non-contaminative property, and easily discarded after use.

The present invention relates to a release film, which is used in a manufacturing process of a printed-circuit board, a flexible printed-circuit board or a multilayer printed-circuit board, having a layer comprising a resin composition comprising a resin having a polar group in a main chain as a matrix and having a halogen content of 5% by weight or less on at least one surface.

6 Claims, No Drawings

RELEASE FILM

BACKGROUND ART

In manufacturing processes of a printed-circuit board, a flexible printed-circuit board and a multilayer printed-circuit board, release films are used in hot pressing a copper clad laminate or copper foil interposing a prepreg or a heat resistant film. And, in a manufacturing process of a flexible printed-circuit board, there is widely used a method of employing a release film in order to prevent the adhesion of a cover lay film to a pressing hot plate when hot press bonding the cover lay film or a reinforcing plate to a flexible printed-circuit board body provided with a electric circuit with a thermosetting adhesive or a thermosetting adhesive sheet through.

As a release film to be used in these uses, there have been employed such a fluorine base film, a silicon-coated polyethylene terephthalate film, a polymethylpentene film and a polypropylene film as disclosed in Japanese Kokai Publication Hei-2-175247 and Japanese Kokai Publication Hei-5-283862.

In recent years, from the growing social requests for environmental issues and safety, the ease of disposal treatment has been required in addition to the heat resistance withstanding hot press forming and a releasing property against a printed-circuit board or a hot pressing plate for these release films. Further, a non-contaminative property to a copper circuit has become important in order to improve the yields of products during hot press forming.

However, the fluorine base films having been heretofore used as a release film has the excellent heat resistance, releasing property and non-contaminative property, but had a problem that it is hard to burn and it generates a harmful gas in incineration for disposal after uses in addition to being expensive. And, the silicon-coated polyethylene terephthalate film and the polymethylpentene film might cause the contamination of a printed-circuit board, particularly a copper circuit, due to the migration of low molecular weight matter contained in silicon or constituents to impair quality. And, the polypropylene film had poor heat resistance and an insufficient releasing property.

And, in Japanese Kokai Publication 2003-313313, there is described a release film having at least one layer comprising a resin composition containing 100 parts by weight of resin comprising at least one species of a thermoplastic resin and/or a thermosetting resin and 0.1 to 100 parts by weight of laminar silicate. This release film does not produce a harmful gas as distinct from a fluorine base film and does not cause contamination due to the migration of the low molecular weight matter as distinct from a silicon-coated polyethylene terephthalate film and a polymethylpentene film and in addition it is extremely superior in heat resistance and a releasing property. However, this release film had a problem that this film was insufficient in point of the conformability to circuit patterns and there might be cases where it could not adequately conform to a printed-circuit board, a flexible printed-circuit board and a multilayer printed-circuit board and a flexible printed board, which are provided with complex electric circuits and have circuit patterns on their surfaces, in hot pressing. Further, since the laminar silicate necessarily has adherents of low molecular weight substances causing an outgas, there was a problem that the outgas resulting from this low molecular weight substance might be generated even slightly and might contaminate a substrate.

SUMMARY OF THE INVENTION

It is an object of the present invention to provide a release film which is superior in the flexibility at high temperature, the conformability to circuit patterns, the heat resistance, the releasing property and the non-contaminative property, and easily discarded after use.

The present invention relates to a release film, which is used in a manufacturing process of a printed-circuit board, a flexible printed-circuit board or a multilayer printed-circuit board, having a layer comprising a resin composition comprising a resin having a polar group in a main chain as a matrix and having a halogen content of 5% by weight or less on at least one surface.

The above resin having a polar group in a main chain is preferably crystalline aromatic polyester, and the above crystalline aromatic polyester more preferably contains at least the butylene terephthalate as a crystal component. In this case, the above crystalline aromatic polyester preferably has heat of fusion of 40 J/g or higher. The above crystalline aromatic polyester preferably has a glass transition temperature of 0 to 100° C.

In the release film of the present invention, it is preferred that an outgas generation rate in the case of heating the film at 170° C. for 10 minutes is 200 ppm or less.

DETAILED DESCRIPTION OF THE INVENTION

Hereinafter, the present invention will be described in more detail.

In the present description, a film refers to not only a film but also a sheet.

A release film of the present invention is a release film to be used in a manufacturing process of a printed-circuit board, a flexible printed-circuit board or a multilayer printed-circuit board. That is, the release film of the present invention can be used, for example, in hot press forming a copper clad laminate or copper foil interposing a prepreg or a heat resistant film in manufacturing processes of a printed-circuit board, a flexible printed-circuit board and a multilayer printed-circuit board. And, the release film of the present invention can be used, for example, when bonding a cover lay film or a reinforcing plate with a thermosetting adhesive agent or a thermosetting adhesive sheet through hot press forming in a manufacturing process of a flexible printed-circuit board.

The release film of the present invention has a layer comprising a resin composition comprising a resin having a polar group in a main chain as a matrix and having a halogen content of 5% by weight or less (hereinafter, also referred to as a releasing layer).

The above resin composition constituting the releasing layer has a halogen content of 5% by weight or less. The release film of the present invention having the layer comprising such a resin composition hardly produces harmful substances including halogens even when being incinerated. The resin composition preferably has a halogen content of 3% by weight or less and more preferably a halogen content of 1% by weight or less. When this halogen content is less than 1% by weight, it is possible to gain a certification of a substantial non-halogen substance in Europe. Incidentally, the halogen content can be measured by using an ordinary halogen analyzer.

The above resin composition constituting the releasing layer comprises a resin having a polar group in a main chain as a matrix. By comprising such a resin as a matrix, the release film of the present invention can exert excellent mechanical performance, particularly in a temperature range of about 170° C. at which hot press is generally implemented.

The polar group in the above resin having a polar group in a main chain is not particularly limited and includes, for example, an ester group, an amide group, an imide group, an ether group, a thioether group, a carbonyl group, a hydroxyl group, an amino group and a carboxyl group.

The above resin having a polar group in a main chain is not particularly limited and includes, for example, polyester compounds, polyphenylene sulfide, polyether ether ketone, polyamide compounds and polyimide compounds. These resins having a polar group in a main chain may be used alone or in combination of two or more species of them. Among others, there is suitably employed crystalline aromatic polyester described below because it does not contain a hetero atom in a molecule and therefore it mitigates an environmental load during incinerating the resins and it is economically advantageous.

The above crystalline aromatic polyester can be obtained by reacting aromatic dicarboxylic acid or an ester-forming derivative thereof with low molecular weight aliphatic diol. Also, the above crystalline aromatic polyester can be obtained by reacting aromatic dicarboxylic acid or an ester-forming derivative thereof with low molecular weight diol and high molecular weight diol (hereinafter, the crystalline aromatic polyester thus obtained is also referred to as crystalline aromatic polyester having a polyether skeleton in a main chain). Further, the above crystalline aromatic polyester can also be obtained by dissolving crystalline aromatic polyester, which is obtained by reacting aromatic dicarboxylic acid or an ester-forming derivative thereof with low molecular weight aliphatic diol, in a caprolactone monomer and then by polymerizing the caprolactone monomer by ring-opening (hereinafter, the crystalline aromatic polyester thus obtained is also referred to as crystalline aromatic polyester having a polycaprolactone skeleton in a main chain). Among others, a release film comprising the crystalline aromatic polyester containing the polyether skeleton in a main chain and/or the crystalline aromatic polyester containing the polycaprolactone skeleton in a main chain becomes one which has excellent flexibility and an excellent releasing property while maintaining heat resistance compared with a release film comprising crystalline aromatic polyester which can be obtained by reacting aromatic dicarboxylic acid or an ester-forming derivative thereof with low molecular weight aliphatic diol.

As the above aromatic dicarboxylic acid or ester-forming derivative thereof, there are given, for example, terephthalic acid, isophthalic acid, orthophthalic acid, naphthalenedicarboxylic acid, paraphenylenedicarboxylic acid, dimethyl terephthalate, dimethyl isophthalate, dimethyl orthophthalate, dimethyl naphthalenedicarboxylate and dimethyl paraphenylenedicarboxylate. These compounds may be used alone or in combination of two or more species.

As the above low molecular weight aliphatic diol, there are given, for example, ethylene glycol, 1,2-propanediol, 1,3-propanediol, 1,3-butanediol, 1,4-butanediol, neopentyl glycohol, 1,5-pentanediol, 1,6-hexanediol and 1,4-cyclohexane dimethanol. These compounds may be used alone or in combination of two or more species.

As the above high molecular weight diol, there are given, for example, polyethylene glycol, polypropylene glycol, polytetramethylene glycohol and polyhexamethylene glycohol. These compounds may be used alone or in combination of two or more species.

As crystalline aromatic polyester comprising the above constituent, there are given, for example, polyethylene terephthalate, polybutylene terephthalate, polyhexamethylene terephthalate, polyethylene naphthalate, polybutylene naphthalate, butanediol terephthalate-polytetramethylene glycol copolymer and butanediol terephthalate-polycaprolactone copolymer. These compounds may be used alone or in combination of two or more species.

The above crystalline aromatic polyester preferably contains at least the butylene terephthalate as a crystal component. By containing the butylene terephthalate component, the above crystalline aromatic polyester becomes superior particularly in a non-contaminative property and crystallinity.

When the above crystalline aromatic polyester contains the butylene terephthalate component as a crystal component, the release film of the present invention preferably has heat of fusion of 40 J/g or higher. When the release film has heat of fusion of lower than 40 J/g, the heat resistance capable of withstanding hot press forming may not be exerted and a dimensional change at 170° C. may increase to impair a circuit pattern during hot press forming. The release film more preferably has heat of fusion of 50 J/g or higher. In order to enhance crystallinity and have high heat of fusion, an additive such as a crystallization agent, which accelerates crystallization, may be added to the above resin composition and further it is preferred to set a cooling temperature during a melt molding at a temperature above a glass transition temperature of the above aromatic polyester when producing the release film of the present invention, and it is more preferred to set the cooling temperature at a temperature of 70 to 150° C. Incidentally, the above heat of fusion can be measured by a differential scanning calorimetry.

The above crystalline aromatic polyester is preferably a mixed resin formed by mixing the crystalline aromatic polyester having the polyether skeleton in a main chain and/or the crystalline aromatic polyester having the polycaprolactone skeleton in a main chain into the crystalline aromatic polyester obtained by reacting aromatic dicarboxylic acid or an ester-forming derivative thereof with low molecular weight aliphatic diol. Such a mixed resin can attain excellent flexibility while maintaining heat resistance by minutely dispersing the crystalline aromatic polyester containing the polyether skeleton and/or the polycaprolactone skeleton in a main chain in a matrix comprising crystalline aromatic polyester not containing the polyether skeleton and/or the polycaprolactone skeleton in a main chain. The release film of the present invention comprising this mixed resin will have a highly excellent balance between the heat resistance/the releasing property and the conformability to circuit patterns on a substrate such as a circuit pattern, a through hole and the like.

The above crystalline aromatic polyester preferably has a glass transition temperature of 0 to 100° C. When this glass transition temperature is higher than 100° C., a releasing property, which is required during hot press forming of a release film, decreases, and flexibility cannot be exerted and therefore the conformability to circuit patterns on a substrate such as a circuit pattern, a through hole and the like may decrease. When it is lower than 0° C., the releasing property during hot press forming decreases, and a handling property of a release film may be deteriorated. Further in this description, a glass transition temperature refers to a temperature at which a maximum resulting from a micro Brownian movement among maxima of a loss tangent (tan δ) obtained in measuring dynamic viscoelasticity appears. The above glass transition temperature can be measured by a publicly known method of using a visco-elastic spectrometer and the like.

In the release film of the present invention, it is preferred that an outgas generation rate in the case of heating the release film at 170° C. for 10 minutes is 200 ppm or less. By having the above releasing layer, the release film of the present invention satisfies the flexibility at high temperature, the conformability to circuit patterns, the heat resistance and the releasing property, which are required as a release film, and further can minimize the generation of outgas and realize a high non-contaminative property. In addition, the above outgas generation rate can be measured by publicly known methods such as gas chromatography analysis by the dynamic headspace method.

The above resin composition constituting the releasing layer may contain a stabilizer. The above stabilizer is not particularly limited and includes, for example, hindered phenol antioxidants such as 1,3,5-trimethyl-2,4,6-tris(3,5-di-t-butyl-4-hydroxybenzyl)benzene, 3,9-bis{2-[3-(3-t-butyl-4-hydroxy-5-methylphenyl)-propionyloxy]-1,1-dimethylethyl}-2,4,8,10-tetraoxaspiro[5,5]undecane and the like; and heat stabilizers such as tris(2,4-di-t-butylphenyl) phosphite, trilauryl phosphite, 2-t-butyl-α-(3-t-butyl-4-hydroxyphenyl)-p-cumenyl bis(p-nonylphenyl)phosphite, dimyristyl 3,3'-thiodipropionate, distearyl 3,3'-thiodipropionate, pentaerythrityl tetrakis(3-laurylthiopropionate) and ditridecyl 3,3'-thiodipropionate.

The above resin composition constituting the releasing layer may contain additives such as fiber, an inorganic filler, a flame retarder, an ultraviolet absorber, an antistatic agent, an inorganic substance and a higher fatty acid salt to the extent not impairing practical utility.

The above fiber is not particularly limited and includes, for example, inorganic fibers such as glass fiber, carbon fiber, boron fiber, silicon carbide fiber, alumina fiber, amorphous fiber, silicon-titanium-carbon fiber and the like; and organic fibers such as aramid fiber and the like.

The above inorganic filler is not particularly limited and includes, for example, calcium carbonate, titanium oxide, mica and talc.

The above flame retarder is not particularly limited and includes, for example, hexabromocyclododecane, tris-(2,3-dichloropropyl)phosphate and pentabromophenylallylether.

The above ultraviolet absorber is not particularly limited and includes, for example, p-t-butylphenyl salicylate, 2-hydroxy-4-methoxybenzophenone, 2-hydroxy-4-methoxy-2'-carboxybenzophenone and 2,4,5-trihydroxybutyrophenone.

The above antistatic agent is not particularly limited and includes, for example, N,N-bis(hydroxyethyl)alkylamines, alkylallyl sulfonates and alkyl sulfonates.

As the above inorganic substance, there are given, for example, barium sulfate, alumina, silicon oxide and the like.

As the above higher fatty acid salt, there are given, for example, sodium stearate, barium stearate, sodium palmitate and the like.

The above releasing layer may have a single layer structure or a multilayer structure. When the above releasing layer has a multilayer structure, by comprising the crystalline aromatic polyester obtained by reacting aromatic dicarboxylic acid or an ester-forming derivative thereof with low molecular weight aliphatic diol as a surface layer, and comprising a resin composition having the excellent flexibility at high temperatures and the high interfacial adhesion between the releasing layer and the above crystalline aromatic polyester, for example, butanediol terephthalate-polytetramethylene glycol copolymer, amorphous polyethylene terephthalate such as polyethylene-1,4-cyclohexylene dimethyleneterephthalate, polyamide-polytetramethylene glycol copolymer, or styrenic thermoplastic elastomer, as a middle layer, it is possible to provide flexibility for a release film while maintaining a releasing property during press forming of a release film and to obtain a release film having a highly excellent balance between the releasing property and the conformability to circuit patterns on a substrate such as a circuit pattern, a through hole and the like.

When the above releasing layer has a two-layer structure, it is preferred that the storage modulus of one layer at 170° C. is lower than that of the other layer at 170° C. And, when the above releasing layer has a multilayer structure of three-layer or more, it is preferred that the storage modulus at 170° C. of at least one layer of intermediate layers is lower than that of a surface layer at 170° C. Having such a structure, a release film can be provided with flexibility while maintaining a releasing property during press forming and can be used as a release film having a highly excellent balance between the releasing property and the conformability to circuit patterns on a substrate such as a circuit pattern, a through hole and the like.

The surface of the above releasing layer preferably has smoothness, but it may be provided with a slipping property or an anti-blocking property required to handle the releasing layer and it may be provided with a moderate embossed pattern on at least one side for the purpose of venting air during hot press forming.

The above releasing layer may be heat treated in order to improve heat resistance, a releasing property and dimensional stability. These improvements increase with increases in heat treatment temperature as long as the heat treatment temperature is lower than a melting point of the resin composition constituting the above releasing layer, and the heat treatment temperature is preferably 170° C. or higher and more preferably 200° C. or higher. As another method of improving the heat resistance, the releasing property and the dimensional stability of the above releasing layer, there are given, for example, a method of drawing in the uniaxial direction or in the biaxial direction and a method of applying friction treatment by solid matter to the surface.

A preferable lower limit of thickness of the releasing layer of the present invention is 5 μm and a preferable upper limit is 200 μm. When this thickness is less than 5 μm, the strength of the releasing layer may become insufficient, and when it is more than 200 μm, a heat conductivity in hot press forming may be deteriorated. More preferably, the lower limit is 10 μm and the upper limit is 100 μm.

The above releasing layer can be prepared by melt molding. The above melt molding is not particularly limited and includes, for example, a conventional method, which is publicly known, of forming a thermoplastic resin film, such as air quenched or water quenched blown film extrusion and flat die extrusion. And, when the above releasing layer has a multilayer structure, it can be produced, for example, by coextrusion flat die method and the like.

The above releasing layer can exert extremely excellent mechanical performance because it has the constitution described above. That is, the above releasing layer, at 170° C. at which hot press is generally implemented, has the storage modulus of 20 to 200 MPa, the load of elongation of 100 percent of 49 to 490 mN/mm and the elongation at break of 500% or more, and it has the dimensional change of 1.5% or less when pressurizing at 170° C. for 60 minutes under a load of 3 MPa. By virtue of being capable of exerting such mechanical performance, the release film of the present invention is extremely suitable as a release film to be used in a manufacturing process of a printed-circuit board, a flexible printed-circuit board or a multilayer printed-circuit board.

When the storage modulus at 170° C. is less than 20 MPa, the heat resistance capable of withstanding hot press forming may not be exerted, and when it is more than 200 MPa, a sheet is not adequately deformed in hot press forming, and therefore the conformability to circuit patterns on a substrate such as a circuit pattern, a through hole and the like may be deteriorated and uniform adhesion of a cover lay film to a circuit pattern in a flexible printed-circuit board, for example, may be deteriorated. A more preferred upper limit of the storage modulus is 150 MPa, and a furthermore preferred upper limit is 100 MPa. Further, the above storage modulus can be measured by a measuring method of dynamic viscoelasticity, a visco-elastic spectrometer, commonly employed.

When the load of elongation of 100 percent at 170° C. is less than 49 mN/mm, the heat resistance capable of withstanding hot press forming may not be exerted in employing the release film of the present invention as a release film, and when it is more than 490 mN/mm, the film is not adequately deformed in hot press forming, and therefore the conformability to circuit patterns on a substrate such as a circuit pattern, a through hole and the like is deteriorated and uniform adhesion of a cover lay film to a circuit pattern in a flexible printed-circuit board, for example, is deteriorated. Further, the above load of elongation of 100 percent is a load by which a distortion reaches 100% in a general tensile test and it can be measured by a method according to JIS K 7127.

When the elongation at break is less than 500% at 170° C., the film may tear during conforming to circuit patterns on a substrate in hot press forming and this may contaminates the substrate. The elongation at break is more preferably 800% or more. In addition, the elongation at break in the present invention can be measured by a method according to JIS K 7127.

When the dimensional change in pressurizing at 170° C. for 60 minutes under a load of 3 MPa is more than 1.5%, a circuit pattern may be impaired in hot press forming. The dimensional change is more preferably 1.0% or less.

When the above releasing layer is overlaid on polyimide and/or metal foil and pressurized at 170° C. for 60 minutes under a load of 3 MPa, it has a high releasing property from the above polyimide and/or metal foil. Further, the above term "having a high releasing property" means that the peel strength generated between the polyimide and/or metal foil and the sheet or film after pressure treatment is low and when peeling them, the polyimide and/or metal foil, or the sheet or film is not damaged.

The above releasing layer further exerts extremely excellent mechanical performance also in a range of room temperature of about 23° C. That is, the above releasing layer, at 23° C. at which usual operations are implemented, has the storage modulus of 1000 to 5000 MPa and the tear resistance is 98 N/mm or larger. By virtue of being capable of exerting such mechanical performance, the release film of the present invention has a highly excellent handling property, and is extremely suitable as a release film to be used when hot press forming in a manufacturing process of a printed-circuit board, a flexible printed-circuit board or a multilayer printed-circuit board, or as a release film to be used when bonding a cover lay film or a reinforcing plate with a thermosetting adhesive agent or a thermosetting adhesive sheet through hot press forming in a manufacturing process of a flexible printed-circuit board.

When the storage modulus at 23° C. is less than 1000 MPa, mechanical strength of a sheet or film at room temperature is reduced, and therefore strength may become insufficient in a process of peeling a film after press forming and a handling property of a sheet or film at room temperature may be deteriorated, and when it is more than 5000 MPa, this adversely affects the conformability to circuit patterns in press forming.

When the tear resistance at 23° C. is less than 98 N/mm, strength may become insufficient in a process of peeling a film after press forming and the adhesion of a resin to a circuit may occur in the case of employing the release film of the present invention as a release film. Such adhesion of a resin to a circuit impairs the conductivity significantly and the whole printed-circuit board becomes a defective. Further, the above tear resistance can be measured by a method according to JIS K 7128 C method (a right angled tear method).

The release film of the present invention may comprise only the above releasing layer or may have a resin film layer in addition to the above releasing layer. The release film of the present invention, in which the above releasing layer is laminated on at least one side of the resin film layer, has a cushion property and strength for pressuring uniformly in hot press forming.

The resin constituting the above resin film layer is not particularly limited but for example, olefinic resins such as polyethylene resin, polypropylene resin, ethylene-methyl methacrylate copolymer and ethylene-vinyl acetate copolymer are preferred because of easy disposal after uses. These compounds may be used alone or in combination of two or more species. Further, the resin film layer may contain modified polyolefins such as acid modified polyolefin and glycidyl modified polyolefin, and the resin constituting the above releasing layer in order to enhance the adhesion to the above releasing layer. And, the melting point of the above resin constituting the resin film layer is preferably 50 to 130° C. in order to prevent a prepreg or a thermosetting adhesive from exuding into a through hole and to attain uniform adhesion to a circuit pattern. Further, the complex viscosity of the above resin constituting the resin film layer at 170° C. is preferably 100 to 10000 Pa·s in order to attain uniform adhesion to a circuit pattern.

The release film of the present invention, having the above resin film layer preferably has an overall softening temperature of 40 to 120° C. When the softening temperature lies within this range, it is possible to inhibit a prepreg or a thermosetting adhesive from exuding into a through hole and to attain uniform adhesion to a circuit pattern. Incidentally, the above softening temperature can be measured according to JIS K 7196.

A method of producing the release film of the present invention, having the above resin film layer, is not particularly limited and includes, for example, an air quenched or water quenched blown film coextrusion method; a method of forming a film by a coextrusion flat die method; a method of laminating by extrusion laminating the resin composition constituting the resin film layer on the above releasing layer previously prepared; and a method of dry laminating the above-mentioned releasing layer and resin film layer which have been separately prepared in advance. Among others, the method of forming a film by a coextrusion flat die method is preferred in that this method is superior in control of thickness of each layer.

Since the release film of the present invention is superior in the flexibility at high temperature, the heat resistance, the releasing property and the non-contaminative property, and can be safely and easily discarded, it is extremely suitable as a release film to be used in a manufacturing process of a printed-circuit board, a flexible printed-circuit board or a multilayer printed-circuit board. That is, the release film of the present invention can be used, for example, in hot press forming a copper clad laminate or copper foil interposing a prepreg or a heat resistant film in manufacturing processes of a printed-circuit board, a flexible printed-circuit board and a multilayer printed-circuit board. And, the release film of the present invention can be used, for example, when bonding a cover lay film or a reinforcing plate with a thermosetting adhesive or a thermosetting adhesive sheet through hot press forming in a manufacturing process of a flexible printed-circuit board.

The release film of the present invention is further useful also as a release film in manufacturing sporting-goods, which are manufacture by curing a prepreg comprising glass cloth, carbon fiber or aramid fiber and an epoxy resin in an autoclave, such as a fishing rod and a golf club/shaft and parts of aircrafts, and as a release film in manufacturing polyurethane foams, ceramic sheets and electrical insulating plates.

BEST MODE FOR CARRYING OUT THE INVENTION

Hereinafter, the present invention will be described in more detail by way of examples, but the present invention is not limited to these examples.

EXAMPLE 1

(1) Preparation of Release Film

Hytrel 2751 (produced by Du Pont-Toray CO., LTD.) was used as a resin composition and melted/plasticized at 250° C. with an extruder and extruded from a flat die to obtain a release film of 50 μm in thickness.

(2) Preparation of Resin Film

A low density polyethylene resin (produced by Japan Polychem Corporation: NOVATEC-LD LE425) was heated to 230° C. and melted/plasticized with an extruder, and extruded from a flat die to obtain a resin film of 100 μm in thickness.

(3) Preparation of Copper Clad Laminate

A polyimide film of 25 μm in thickness (produced by Du Pont-Toray CO., LTD.: KAPTON) was used as a base film, and a copper clad laminate was prepared by bonding copper foil of 35 μm in thickness and copper foil of 50 μm in thickness to the surfaces of the base film with an epoxy adhesive layer of 20 μm in thickness.

(4) Preparation of Cover Lay Film

A cover lay film was prepared by applying an epoxy adhesive having a flow beginning temperature of 80° C. in a thickness of 20 μm onto a polyimide film of 25 μm in thickness (produced by Du Pont-Toray CO., LTD.: KAPTON).

(5) Preparation of Flexible Printed-circuit Board

The resulting release film, copper clad laminate, cover lay film, release film and resin film were overlaid in this order to form a set of overlaid resins, and 32 sets of overlaid resins were placed on a hot press and hot pressed under conditions of a press temperature 170° C., a press pressure 3 MPa and a press time 45 minutes, and then the press pressure was released, the resin film was removed and the release film was peeled off to obtain a flexible printed-circuit board.

The cover lay film of the resulting flexible printed-circuit board was in absolute contact with a substrate body and no remaining air was observed. The release film was completely peeled off from an electrode portion comprising a part without the cover lay film of the copper foil and the copper foil of the electrode portion was completely exposed. And, the conductivity of the electrode portion was adequate. Further, the range of adhesive runoff to the copper foil surface in the part without the cover lay film was within 0.1 mm from the end of the cover lay film and therefore an effect of preventing the adhesive runoff was sufficient. Also, no deformation of the circuit was found.

EXAMPLE 2

A flexible printed-circuit board was prepared by following the same procedure as in Example 1 except that Hytrel 5557 (produced by Du Pont-Toray CO., LTD.) was used as a resin composition and melted/plasticized at 250° C. with an extruder and a release film of 50 μm in thickness was prepared by extruding the plasticized resin composition from a flat die and the resulting film was used.

EXAMPLE 3

A flexible printed-circuit board was prepared by following the same procedure as in Example 1 except that PELPRENE S9001 (produced by TOYOBO CO., LTD.) was used as a resin composition and melted/plasticized at 250° C. with an extruder and a release film of 50 μm in thickness was prepared by extruding the plasticized resin composition from a flat die and the resulting film was used.

EXAMPLE 4

A flexible printed-circuit board was prepared by following the same procedure as in Example 1 except that PELPRENE S3001 (produced by TOYOBO CO., LTD.) was used as a resin composition and melted/plasticized at 250° C. with an extruder and a release film of 50 μm in thickness was prepared by extruding the plasticized resin composition from a flat die and the resulting film was used.

EXAMPLE 5

A flexible printed-circuit board was prepared by following the same procedure as in Example 1 except that Novaduran 5040ZS (produced by Mitsubishi Engineering-Plastics Corporation) was used as a resin composition and melted/plasticized at 250° C. with an extruder and a release film of 50 μm in thickness was prepared by extruding the plasticized resin composition from a flat die and the resulting film was used.

EXAMPLE 6

A flexible printed-circuit board was prepared by following the same procedure as in Example 1 except that a mixture of 70 parts by weight of Novaduran 5040ZS (produced by Mitsubishi Engineering-Plastics Corporation) and 30 parts by weight of Hytrel 7247 (produced by Du Pont-Toray CO., LTD.) was used as a resin composition and melted/plasticized at 250° C. with an extruder and a release film of 50 μm in thickness was prepared by extruding the plasticized resin composition from a flat die and the resulting film was used.

EXAMPLE 7

A flexible printed-circuit board was prepared by following the same procedure as in Example 1 except that a mixture of 70 parts by weight of Novaduran 5040ZS (produced by Mitsubishi Engineering-Plastics Corporation) and 30 parts by weight of PELPRENE S6001 (produced by TOYOBO CO., LTD.) was used as a resin composition and melted/plasticized at 250° C. with an extruder and a release film of 50 μm in thickness was prepared by extruding the plasticized resin composition from a flat die and the resulting film was used.

EXAMPLE 8

A flexible printed-circuit board was prepared by following the same procedure as in Example 1 except that Selar PT7001 (produced by Du Pont-Toray CO., LTD.) was used as a resin composition, melted/plasticized at 290° C. with an extruder and extruded with a flat die and then a release film of 50 μm in thickness was prepared by longitudinally drawing twice as long the extruded resin composition and annealing the drawn resin at 230° C. and the resulting film was used.

EXAMPLE 9

A flexible printed-circuit board was prepared by following the same procedure as in Example 1 except for preparing a release film having a three layer structure, in which a layer with thickness of 10 μm comprising Novaduran 5040ZS (produced by Mitsubishi Engineering-Plastics Corporation), a layer with thickness of 30 μm comprising Hytrel 7247 (produced by Du Pont-Toray CO., LTD.) and a layer with thickness of 10 μm comprising Novaduran 5040ZS (produced by Mitsubishi Engineering-Plastics Corporation) were overlaid in this order, using a three layer coextruder and using the resulting film.

COMPARATIVE EXAMPLE 1

A flexible printed-circuit board was prepared by following the same procedure as in Example 1 except that NOVATEC-PP FB3GT (produced by Japan Polychem Corporation) was used as a resin composition and melted/plasticized at 250° C. with an extruder and a release film of 50 μm in thickness was prepared by extruding the plasticized resin composition from a flat die and the resulting film was used.

COMPARATIVE EXAMPLE 2

A flexible printed-circuit board was prepared by following the same procedure as in Example 1 except for using OPULENT X-88B (produced by Mitsui Chemicals, Inc.) comprising polymethylpentene of 50 μm in thickness, as a release film.

COMPARATIVE EXAMPLE 3

A flexible printed-circuit board was prepared by following the same procedure as in Example 1 except that 100 parts by weight of Hytrel 5557 (produced by Du Pont-Toray CO., LTD.) and 7.7 parts by weight of natural montmorillonite which was organized with distearyl dimethyl quaternary ammonium salt (produced by HOJUN Co., Ltd., New S-BEN D) were charged into a extruder as a thermoplastic resin composition and melted/plasticized at 230° C. and a film of 50 μm in thickness was prepared by extruding the plasticized resin composition from a flat die and the resulting film was used.

Heat of fusion, a storage modulus, a glass transition temperature, an elongation at break, a dimensional change and an outgas generation rate of the release films prepared in Examples 1 to 9 and Comparative Examples 1 to 3 were measured according to the following procedures.

And, a peeling property and adhesion in preparing flexible printed-circuit boards using these release films, and contamination of an electrode and deformation of a circuit after preparing flexible printed-circuit boards were visually observed and evaluated.

The results of evaluation and the raw materials and the compositions of the respective release films are shown in Tables 1 to 4.

(Measurement of Heat of Fusion)
Measurement was carried out at a temperature raising rate of 5° C./minute using a differential scanning calorimeter (DSC 2920 manufactured by TA Instruments).

(Measurement of Storage Modulus)
Measurement was carried out at a temperature raising rate of 5° C./minute, a frequency of 10 Hz and a distortion of 0.05% using a visco-elastic spectrometer (manufactured by Rheometric Scientific Inc., RSA-11), and the storage moduli at 23° C. and 170° C. were determined.

(Measurement of Glass Transition Temperature)
Measurement was carried out at a temperature raising rate of 5° C./minute, a frequency of 10 Hz and a distortion of 0.05% using a visco-elastic spectrometer (manufactured by Rheometric Scientific Inc., RSA-11), and a temperature at which a maximum of the resulting loss tangent (tan δ) appears was taken as a glass transition temperature.

(Measurement of Elongation at Break)
A No. 2 type stamped test piece was measured at 170° C. and a test speed of 500 mm/minute according to JIS K 7127.

(Measurement of Tear Resistance)
A stamped test piece for a right angled tear test was measured at 23° C. and a test speed of 500 mm/minute according to JIS K 7128 C method.

(Measurement of Load of Elongation of 100 Percent)
A No. 2 type stamped test piece was measured at 170° C. and a test speed of 500 mm/minute according to JIS K 7127.

(Measurement of Dimensional Change)
Reference lines with 100-mm pitches were drawn in the direction of extrusion (MD) and in the direction orthogonal thereto (TD) on the surface of the release film. After the release film was pressed at 170° C. for 60 minutes under a load of 3 MPa, a distance between reference lines was measured and the averages of 32 sets of these distances were taken as $L_{MD}$ and $L_{TD}$. The dimensional change in each direction was determined from the following equations.

Dimensional change (%) in $MD=(L_{MD}-100)/100\times100$

Dimensional change (%) in $TD=(L_{TD}-100)/100\times100$ (Measurement of Outgas Generation Rate)
Using ATD-400 (manufactured by PerkinElmer Japan Co., Ltd.) as a thermal desorption apparatus, gas, which was generated from a film by heating a film at 170° C. for 10 minutes in a stream of inert gas of 25 mL/minute, was collected by the dynamic headspace method. The gas was separated by using Automass II-15 manufactured by JEOL Ltd., to which a non-polar capillary column was connected, and the total area of the detected peak was converted to an amount of toluene equivalent and normalized by a film weight. The resulting amount was taken as an outgas generation rate.

TABLE 1

|  |  | Species of resin | Polar group | Location of polar group | Halogen content (weight %) | Crystalline aromatic polyester | Skelton of butylene terephthalate | Copolymerization component in polymer |
|---|---|---|---|---|---|---|---|---|
| Product name | Hytrel 2751 | polyester resin | present | in main chain | 0 | present | present | polyether |
|  | Hytrel 7247 | polyester resin | present | in main chain | 0 | present | present | polyether |
|  | Hytrel 5557 | polyester resin | present | in main chain | 0 | present | present | polyether |

TABLE 1-continued

|  | Species of resin | Polar group | Location of polar group | Halogen content (weight %) | Crystalline aromatic polyester | Skelton of butylene terephthalate | Copolymerization component in polymer |
|---|---|---|---|---|---|---|---|
| PELPRENE S9001 | polyester resin | present | in main chain | 0 | present | present | polycaprolactone |
| PELPRENE S6001 | polyester resin | present | in main chain | 0 | present | present | polycaprolactone |
| PELPRENE S3001 | polyester resin | present | in main chain | 0 | present | present | polycaprolactone |
| Novaduran 5040ZS | polyester resin | present | in main chain | 0 | present | present | none |
| Selar PT7001 | polyester resin | present | in main chain | 0 | present | none | none |
| NOVATEC-PP FB3GT | polypropylene resin | none | — | 0 | none | none | none |
| OPULENT X88B | polymethylpentene resin | none | — | 0 | none | none | none |

TABLE 2

|  | Component 1 | | Component 2 | | | |
|---|---|---|---|---|---|---|
|  | species | quantity | species | quantity | Thickness | Note |
| Example 1 | Hytrel 2751 | 100 | — | — | 50 | — |
| Example 2 | Hytrel 5557 | 100 | — | — | 50 | — |
| Example 3 | PELPRENE S9001 | 100 | — | — | 50 | — |
| Example 4 | PELPRENE S3001 | 70 | — | — | 50 | — |
| Example 5 | Novaduran 5040ZS | 100 | — | — | 50 | — |
| Example 6 | Novaduran 5040ZS | 70 | Hytrel 7247 | 30 | 50 | blended resin |
| Example 7 | Novaduran 5040ZS | 70 | PELPRENE S6001 | 30 | 50 | blended resin |
| Example 8 | Selar PT7001 | 100 | — | — | 50 | — |
| Example 9 | Novaduran 5040ZS | 100 | — | — | 10 | coextruded three layers |
|  | Hytrel 7247 | 100 | — | — | 30 | strage modulus of surface layer (170° C.): 180 MPa |
|  | Novaduran 5040ZS | 100 | — | — | 10 | strage modulus of intermediate layer (170° C.): 45 MPa |
| Comparative Example 1 | NOVATEC-PP FB3GT | 100 | — | — | 50 | — |
| Comparative Example 2 | OPULENT X88B | 100 | — | — | 50 | — |
| Comparative Example 3 | Hytrel 5557 | 100 | Natural montmorillonite organized with distearyl dimethyl quaternary ammonium salt (produced by HOJUN Co., Ltd., New S-BEN D) | 7.7 | 50 | laminar silicate was blended |

TABLE 3

|  | Evaluation at 170° C. | | | | Evaluation at 23° C. | | Heat of melting of crystal (J/g) | Outgas generating rate (ppm) | Glass transition temperature (° C.) |
|---|---|---|---|---|---|---|---|---|---|
|  | Halogen content (weight %) | strage modulus (MPa) | elongation at break (%) | load of elongation of 100% (mN/mm width) | dimensional change (%) | strage modulus (MPa) | tear resistance (N/mm Thickness) | | | |
| Example 1 | 0 | 130 | 1400 | 450 | MD1.1/TD1.1 | 1800 | 170 | 45 | 100 | 53 |
| Example 2 | 0 | 60 | 1700 | 150 | MD1.3/TD1.3 | 200 | 90 | 42 | 150 | −17 |
| Example 3 | 0 | 140 | 1300 | 480 | MD1.1/TD1.1 | 2000 | 190 | 47 | 150 | 55 |
| Example 4 | 0 | 80 | 1500 | 160 | MD1.3/TD1.4 | 220 | 100 | 43 | 250 | −3 |
| Example 5 | 0 | 190 | 800 | 540 | MD0.7/TD0.6 | 2500 | 200 | 55 | 40 | 65 |
| Example 6 | 0 | 140 | 1000 | 500 | MD0.7/TD0.6 | 1700 | 180 | 49 | 80 | 64 |
| Example 7 | 0 | 145 | 1000 | 500 | MD0.6/TD0.6 | 1800 | 190 | 50 | 100 | 64 |
| Example 8 | 0 | 420 | 700 | 780 | MD0.1/TD0.0 | 4500 | 490 | — | 40 | 120 |
| Example 9 | 0 | 70 | 1100 | 150 | MD0.7/TD0.6 | 1700 | 170 | 55 | 80 | 65 |
| Comparative Example 1 | 0 | 5 | unmeasurable | unmeasurable | unmeasurable | 1500 | 40 | — | — | — |
| Comparative Example 2 | 0 | 125 | 1150 | 180 | MD1.0/TD0.8 | 2100 | 30 | — | 600 | — |
| Comparative Example 3 | 0 | 100 | 1700 | 170 | MD0.5/TD0.5 | 500 | 130 | 42 | 350 | −17 |

TABLE 4

| | Evaluation | | | |
|---|---|---|---|---|
| | peeling property | adhesion | contamination of electrode | deformation of circuit |
| Example 1 | good | good | none | none |
| Example 2 | heavy somewhat but no problem | good | none | none |
| Example 3 | good | good | none | none |
| Example 4 | heavy somewhat but no problem | good | none | none |
| Example 5 | good | a few voids are observed but no problem | none | none |
| Example 6 | good | good | none | none |
| Example 7 | good | good | none | none |
| Example 8 | heavy somewhat but no problem | voids are observed but no problem | none | none |
| Example 9 | good | good | none | none |
| Comparative Example 1 | | | melted and impractical | |
| Comparative Example 2 | good | good | there was a cloud on an electrode and conduction failure occurred | none |
| Comparative Example 3 | heavy somewhat but no problem | good | there was a cloud on a part of electrode | none |

INDUSTRIAL APPLICABILITY

In accordance with the present invention, it is possible to provide the release film which is superior in the flexibility at high temperature, the conformability to circuit patterns, the heat resistance, the releasing property and the non-contaminative property, and easily discarded after use.

The invention claimed is:

1. A release film,
which is used in a manufacturing process of a printed-circuit board, a flexible printed-circuit board or a multi-layer printed-circuit board,
said release film not including a laminar silicate and having a layer consisting essentially of a resin composition comprising a resin having a polar group in a main chain as a matrix and having a halogen content of 5% by weight or less on at least one surface,
wherein the resin having a polar group in a main chain is crystalline aromatic polyester, and
wherein an outgas generation rate in the case of heating the release film at 170° C. for 10 minutes is 200 ppm or less.

2. The release film according to claim 1,
wherein the crystalline aromatic polyester contains at least butylene terephthalate as a crystalline component.

3. The release film according to claim 2,
wherein heat of fusion is 40 j/g or higher.

4. The release film according to claim 1,
wherein the crystalline aromatic polyester has a glass transition temperature of 0 to 100° C.

5. The release film according to claim 2,
wherein the crystalline aromatic polyester has a glass transition temperature of 0 to 100° C.

6. The release film according to claim 3,
wherein the crystalline aromatic polyester has a glass transition temperature of 0 to 100° C.

* * * * *